United States Patent
Nemani et al.

(10) Patent No.: US 7,176,105 B2
(45) Date of Patent: Feb. 13, 2007

(54) DIELECTRIC GAP FILL WITH OXIDE SELECTIVELY DEPOSITED OVER SILICON LINER

(75) Inventors: Srinivas Nemani, Sunnyvale, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 157 days.

(21) Appl. No.: 10/858,135

(22) Filed: Jun. 1, 2004

(65) Prior Publication Data

US 2005/0266655 A1 Dec. 1, 2005

(51) Int. Cl.
- *H01L 21/336* (2006.01)
- *H01L 21/76* (2006.01)
- *H01L 21/311* (2006.01)

(52) U.S. Cl. .............. 438/430; 438/424; 438/432; 438/296; 438/700

(58) Field of Classification Search .......... 438/270, 438/296, 424, 430, 432, 589, 637, 672, 700
See application file for complete search history.

(56) References Cited

U.S. PATENT DOCUMENTS

| | | | |
|---|---|---|---|
| 6,136,664 A | 10/2000 | Economikos et al. | |
| 6,137,152 A | 10/2000 | Wu | |
| 6,306,723 B1 | 10/2001 | Chen et al. | |
| 6,372,606 B1 * | 4/2002 | Oh | 438/435 |
| 6,406,975 B1 * | 6/2002 | Lim et al. | 438/421 |
| 6,509,239 B1 | 1/2003 | Nuttall et al. | |
| 6,682,986 B2 * | 1/2004 | Kim | 438/426 |
| 6,727,569 B1 * | 4/2004 | Gardner et al. | 257/513 |
| 6,794,279 B1 * | 9/2004 | Stephen et al. | 438/585 |
| 6,828,210 B2 * | 12/2004 | Kim et al. | 438/424 |
| 6,946,359 B2 * | 9/2005 | Yang et al. | 438/425 |
| 6,960,781 B2 * | 11/2005 | Currie et al. | 257/19 |

FOREIGN PATENT DOCUMENTS

EP 0959496 A2 11/1999

OTHER PUBLICATIONS

Geiger et al., U.S. Appl. No. 09/632,425, filed Aug. 4, 2000 for Process for Depositing Low Dielectric Constant Silicone Oxide Film.

* cited by examiner

*Primary Examiner*—Luan Thai
(74) *Attorney, Agent, or Firm*—Townsend and Townsend and Crew LLP

(57) ABSTRACT

A thin layer of silicon is deposited within a high aspect ratio feature to provide a template for selective deposition of oxide therein. In accordance with one embodiment, amorphous silicon is deposited within a shallow trench feature overlying an oxide liner grown therein. After exposure to sputtering to remove the amorphous silicon from outside of the trench, oxide is selectively deposited over the amorphous silicon to fill the trench from the bottom up without voids, thereby creating a shallow trench isolation (STI) structure. Deposition of the amorphous silicon or other silicon containing layers allows the selective oxide deposition step to be integrated with a thermally-grown oxide trench liner.

24 Claims, 7 Drawing Sheets

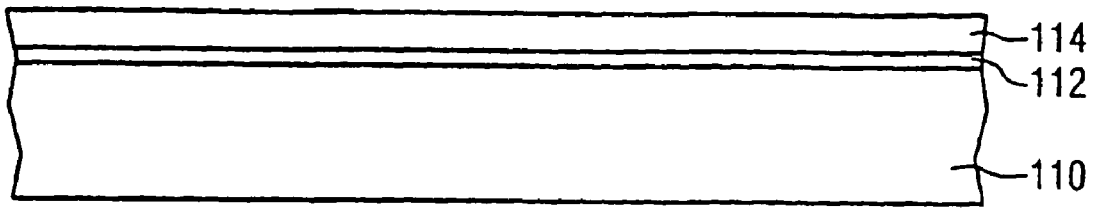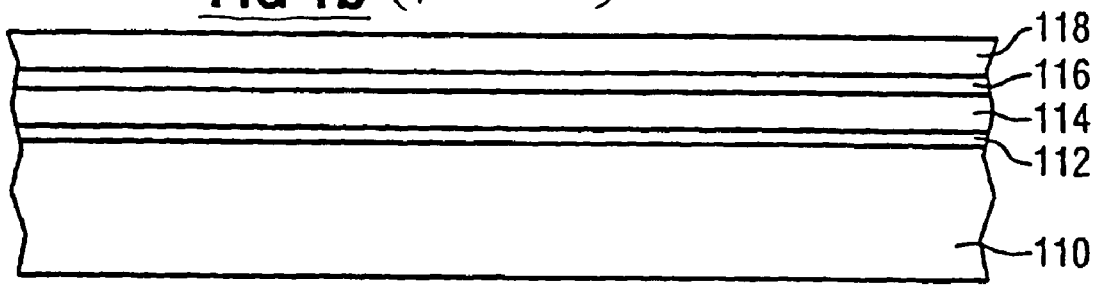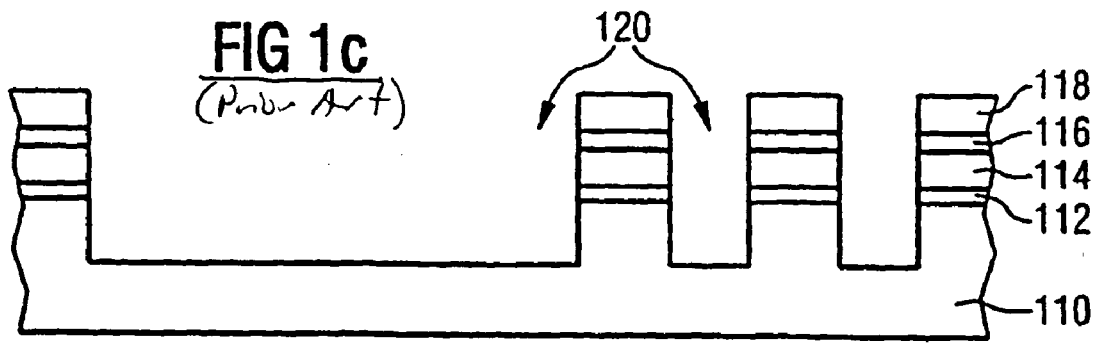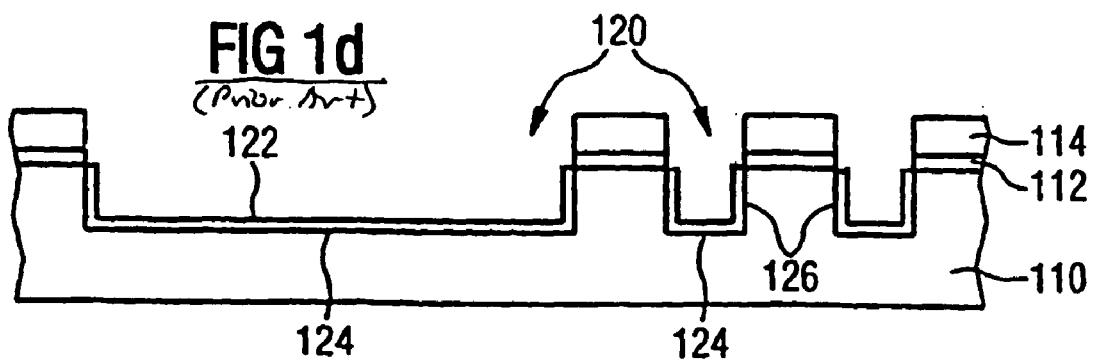

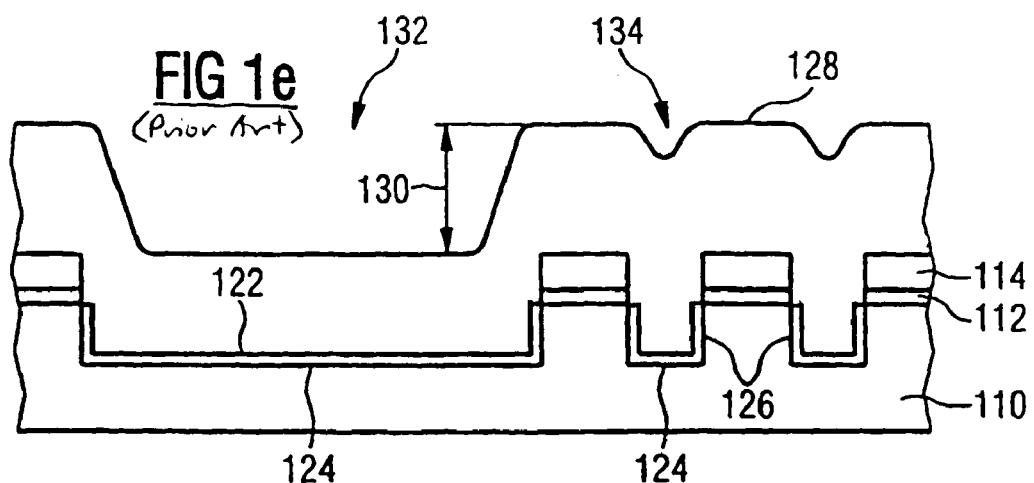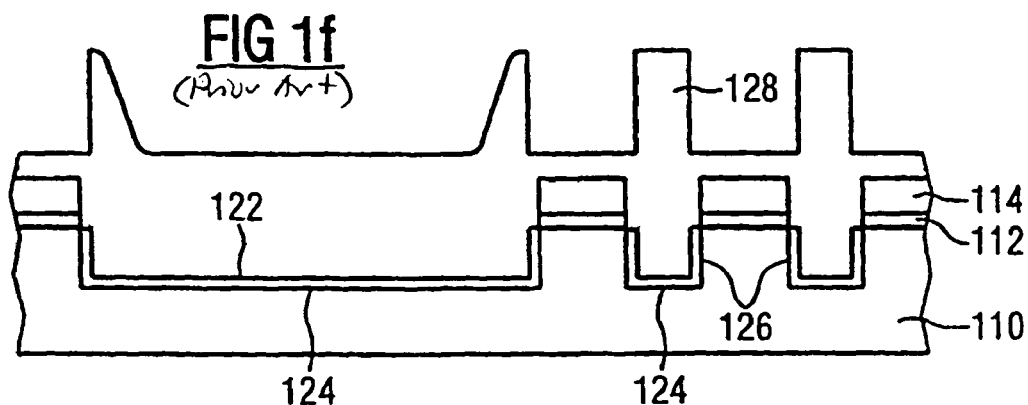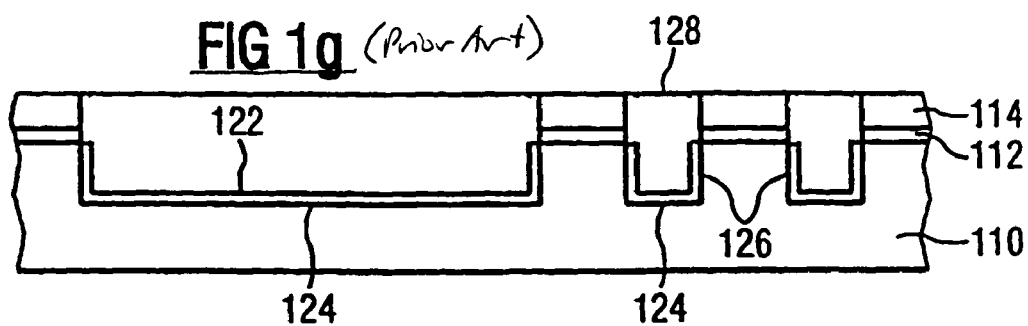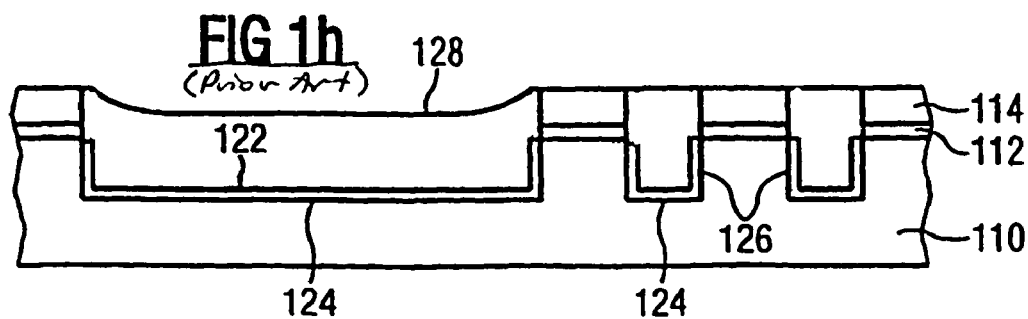

DIELECTRIC GAP FILL WITH OXIDE SELECTIVELY DEPOSITED OVER SILICON LINER

BACKGROUND OF THE INVENTION

The present invention relates generally to the fabrication of integrated circuits. More particularly, the present invention is directed toward a method of performing gap-fill in integrated circuit devices. Merely by way of example, the invention has been applied to a method for providing self-planarized deposition of high quality dielectric layers for shallow trench isolation. The method can be applied to other applications as well such as inter-metal dielectric and pre-metal dielectric deposition.

Semiconductor device geometries continue to decrease in size, providing more devices per unit area on a fabricated wafer. These devices are typically initially isolated from each other as they are built into the wafer, and they are subsequently interconnected to create the specific circuit configurations desired. Currently, some devices are fabricated with feature dimensions as small as 0.18 µm. For example, spacing between devices such as conductive lines or traces on a patterned wafer may be separated by 0.18 µm, leaving recesses or gaps of a comparable size. A nonconductive layer of dielectric material, such as silicon dioxide ($SiO_2$), is typically deposited over the features to fill the aforementioned gaps (gap-fill) and insulate the features from other features of the integrated circuit in adjacent layers or from adjacent features in the same layer.

Dielectric layers are used in various applications including shallow trench isolation (STI) dielectric for isolating devices and interlayer dielectric (ILD) formed between metal wiring layers or prior to a metallization process. In some cases, STI is used for isolating devices having feature dimensions as small as under about 0.5 µm. In some of these cases, the aspect ratio of the depth to width of the trench to be filled exceeds 6:1. Planarization of dielectric layers has become increasingly important as the packing densities of semiconductor devices continue to grow.

The planarization issue is described using an example of a typical process for forming an STI dielectric, commonly referred to as STI integration, as illustrated in FIGS. 1a–1h. In FIG. 1a, a silicon substrate 110 has deposited thereon a pad oxide layer 112 and a nitride layer 114 such as silicon nitride. The nitride layer 114 is typically deposited by low pressure chemical vapor deposition (LPCVD), and serves as an etch stop for chemical mechanical polishing (CMP).

Referring to FIG. 1b, a bottom anti-reflective coating (BARC) 116 is formed above the nitride layer 114 for absorbing light reflected from the substrate 110 during photolithography. Typically an organic spin-on glass (SOG), the BARC 116 is needed typically for light having wavelengths of below about 248 nm, including deep ultraviolet (DUV) and far ultraviolet (FUV) light. A photoresist 118 is formed over the BARC 116 and exposed using a mask (not shown) which defines the location of the trenches.

The exposed photoresist is then stripped to leave open areas for forming the trenches. Typically, a plasma etch is performed to etch the open areas through the BARC 116, the nitride 114, pad oxide 112, and silicon substrate 110 to form the trenches 120, as shown in FIG. 1c.

After the remaining photoresist 118 and BARC 116 are removed, a thermal oxide 122 is typically grown on the surfaces of the trenches 120 (trench bottom 124 and trench wall 126) to repair the plasma damage to the silicon substrate 110, as illustrated in FIG. 1d.

A dielectric layer 128 is then deposited over the thermal oxide 122 to fill the trenches 120 and cover the nitride layer 114. This dielectric layer 128 is often referred to as a trench oxide filling layer. Typical dielectric layers are formed from oxide materials such as silicon dioxide or silicate glass. As shown in FIG. 1e, the surface profile of the deposited dielectric layer 128 is stepped and generally resembles the shape of the trenched substrate 110. The surface profile is more uniform in dense fields with closely space narrow trenches than in open fields with wide trenches. As seen in FIG. 1e, a step height 130 is formed in the dielectric profile between the dense field 134 and the open field 132.

Because of the step height 130, it is not practicable to apply CMP directly after the dielectric layer deposition step to planarize the dielectric layer 128 because otherwise a dishing effect in the open field 132 will result with CMP, as seen in FIG. 1h. Instead, a reverse mask and etch procedure is used to etch the extra oxide to obtain a more planar surface profile as illustrated in FIG. 1f. This procedure typically involves the steps of photoresist deposition, reverse masking, cure, etched photoresist removal, etchback, and removal of remaining photoresist.

A CMP procedure is then applied to the structure of FIG. 1f to globally planarize the surface of the filled substrate 110 as shown in FIG. 1g. The reverse mask and etch procedure necessitated by the step height effect adds significant cost and complexity to the planarization procedure, for example, due to the added lithography steps involved.

From the discussion above, it is seen that multiple steps, including additional photolithography steps (which require expensive equipment), are needed to provide STI as described in relation to FIGS. 1a–1h. However, it is desirable to reduce the number of steps (and related equipment, especially photolithography equipment which requires expensive lenses, light sources, etc.) and to obtain improved results in order to provide a more economic and efficient manufacturing process. For example, one way to obtain improved results is to provide a self-planarized, high quality trench oxide filling layer at a reduced cost.

A number of procedures are known for depositing dielectric layers such as the gap-fill dielectric 128 for the trench oxide filling layer in the example shown in FIG. 1e. One type of process employs $O_3$ (ozone) and TEOS (tetraethylorthosilicate) for depositing a dielectric film such as silicate glass. Such deposited films are commonly referred to as "$O_3$/TEOS films." Such $O_3$/TEOS processes have a surface sensitivity which increases as the $O_3$/TEOS ratio increases. Due to the surface sensitivity, the dielectric deposition rate varies in accordance with the properties of the material of the underlying layer.

It is known to minimize the surface sensitivity by depositing a surface insensitive barrier layer prior to the $O_3$/TEOS film deposition. For instance, one known process involves a plasma-enhanced TEOS (PETEOS) deposition, followed by a surface treatment and then a thin cap TEOS layer. This process undesirably requires additional process steps.

Another known method is to lower the surface sensitivity by decreasing the $O_3$/TEOS ratio. However, lowering the $O_3$/TEOS ratio tends to undesirably result in a more porous dielectric film. This is particularly problematic when the dielectric film is used for isolation purposes. One way to address this concern has been to raise the process temperature to above about 500° C., but raising the process temperature is often undesirable. Alternatively, an additional anneal process after the deposition of the trench oxide filling layer and sandwiching PETEOS layers has been used to densify the trench oxide filling layer. This method, however, suffers from the need to perform an extra step.

Instead of minimizing the surface sensitivity, some have utilized the deposition rate dependence of $O_3$/TEOS films to perform gap fill for a trenched silicon substrate wherein the side walls of the trench are covered with thermal oxide spacers. Using an atmospheric pressure chemical vapor deposition (APCVD) $O_3$/TEOS deposition and an ozone concentration of 5%, it was reported that faster film growth on the bottom silicon than on the side wall spacers precluded void formation to achieve void-free gap fill.

Others have investigated the feasibility of forming a planarized inter-metal dielectric (IMD) by taking advantage of the surface sensitivity of $O_3$/TEOS and similar materials such as $O_3$-octamethylcyclotetrasiloxane (OMTC). Researchers have reported difficulties in controlling the different deposition rates to achieve planarity. For instance, significant elevations have been observed at the edges of aluminum metal lines caused by the different deposition rates of the $O_3$/TEOS on a TiN anti-reflective coating (ARC) layer on top of the aluminum and the aluminum side walls. Some of these same researchers have reported more satisfactory planarization results for depositing $SiO_2$ layers on an aluminum interconnect built upon a phosphorus glass (PSG) level using $O_3$-OMTC.

In light of the above, attempts to obtain planarity by depositing surface sensitive dielectric layers have not always been successful. In addition, the inventors have discovered that these methods may produce dielectric layers that do not have the desired quality. What is needed are more efficient and economic methods for self-planarized deposition of a high quality trench oxide filling layer for STI integration.

SUMMARY OF THE INVENTION

According to embodiments of the present invention, a method for fabricating integrated circuits is provided. More particularly, the present invention is directed toward a method of performing gap-fill in integrated circuit devices. Merely by way of example, the invention has been applied to a method for providing self-planarized deposition of high quality dielectric layers for shallow trench isolation. The method can be applied to other applications as well, for example to deposition of pre-metal dielectric (PMD) between raised features present on the surface of a workpiece.

An embodiment of a method in accordance with the present invention for depositing a fill layer in a recess, comprises, disposing in a substrate processing chamber a substrate having a recess, and forming a first insulating layer within the recess. A silicon containing layer is deposited on the substrate, and an upper portion of the silicon containing layer is removed while maintaining a portion of the silicon containing layer within the recess. A second insulating layer is selectively deposited within the recess and then etched, and a third insulating layer is deposited on the substrate and over the second insulating layer to form a capping layer.

An embodiment of a method of performing gap-fill in a high aspect ratio recess, comprises, forming an oxide liner within a high aspect ratio recess on a semiconductor workpiece, and depositing a silicon containing liner on the workpiece and within the recess over the oxide liner. The silicon containing liner is etched to remove a portion of the silicon containing liner from outside of the recess and from an upper portion of the recess. A first insulating layer is selectively deposited within the trench overlying the silicon containing liner. The first insulating layer is etched, and then a second insulating layer is deposited.

A further understanding of embodiments in accordance with the present invention can be made by way of reference to the ensuing detailed description taken in conjunction with the accompanying drawings.

BRIEF DESCRIPTION OF THE DRAWINGS

FIGS. 1a–1h are simplified schematic vertical cross-sectional views of a substrate, demonstrating trench formation and trench fill by a dielectric material employing prior art deposition methods.

DESCRIPTION OF THE SPECIFIC EMBODIMENTS

According to the present invention, a method of fabricating integrated circuits is provided. More particularly, the present invention is directed toward a method of performing gap-fill in integrated circuit devices. Merely by way of example, the invention has been applied to a method for providing self-planarized deposition of high quality dielectric layers for STI. The method can be applied to other applications as well, for example deposition of pre-metal dielectric (PMD) between raised features present on the surface of a semiconductor workpiece.

Figure 2:
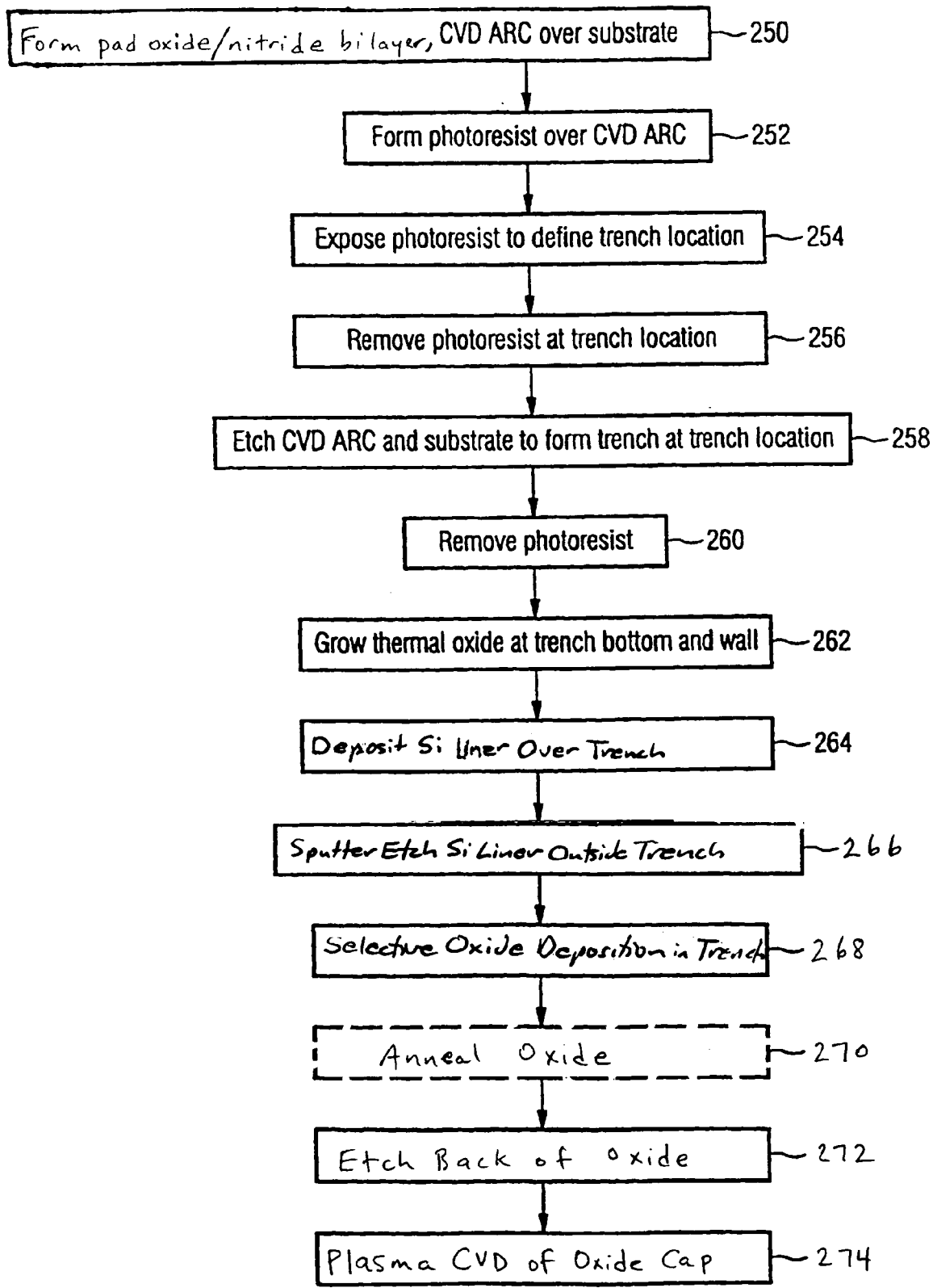
FIG. 2 is a flow diagram of an embodiment of a method of filling a trench in accordance with the present invention.

FIG. 2 shows a flow diagram of an embodiment of a method of filling a trench in accordance with the present invention. First, a pad oxide/nitride bilayer (reference 302 in FIG. 3A) is formed over a substrate. An anti-reflective coating (ARC) is deposited by chemical vapor deposition (CVD) on top of the substrate over the pad oxide/nitride bilayer (step 250). Photoresist is formed over the CVD ARC (step 252). The photoresist is exposed to define the location of the trench (254). Photoresist is developed and removed at the trench location (256).

Next, the CVD ARC and the underlying nitride/pad oxide layers are etched to form the trench at the trench location (step 258). Often, a plasma etching step is utilized to form the trench. In embodiments according to the present invention, the trench is a high aspect ratio trench. In a specific embodiment, the aspect ratio of the depth to width of the high aspect ratio trench is greater than 6:1. Photoresist is then removed by stripping (step 260).

Figure 3A:
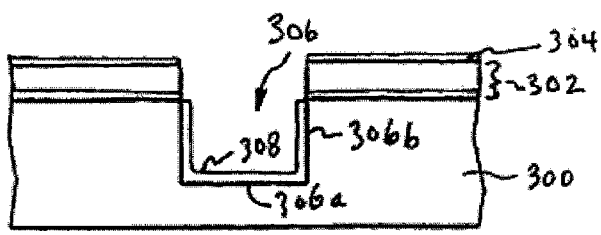
FIGS. 3A–3F are simplified schematic vertical cross-sectional views of an embodiment of a method of filling a trenched substrate in accordance with the present invention.

In the next step (262) of this embodiment as illustrated in FIG. 2 and also shown in simplified cross-section in FIG. 3A, substrate 300 (with pad oxide/nitride bilayer 302 and CVD ARC layer 304) bearing the etched trench 306 is exposed to an oxidizing ambient, such that thermal oxide 308 is grown from the silicon at the bottom 306a and walls 306b of the trench 306. This thermal oxide 308 may be referred to as an oxide liner. As previously described, the thermal oxidation serves to repair damage to the substrate caused by the previous plasma etching step (258). Moreover, a thermal oxide typically provides a higher density oxide layer than those produced using CVD processes.

In embodiments according to the present invention, the oxide liner may be grown using predetermined growth parameters, including, but not limited to temperature, time, and ambient composition. The thermal oxide liner is typically grown according to techniques known to those of skill in the art. In a particular embodiment, an in situ steam generation (ISSG) process is utilized with a chamber pressure in the range of 5–20 Torr, an ambient containing $H_2$ and $O_2$ in a predetermined ratio and a substrate temperature in the range from about 500° C.–about 900° C. In a specific embodiment, the ratio of $H_2$ to $O_2$ is 1:2. Alternative embodiments utilize different growth parameters including parameters that change as a function of time to achieve the growth of the oxide liner.

Figure 3B:
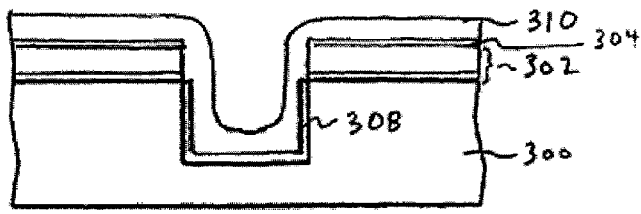

In the next step (264) shown in simplified cross-section in FIG. 3B, a conformal silicon-containing material 310 is deposited within and outside of the trench. This material 310 may be referred to as a silicon liner. Silicon-containing material 310 can comprise, for example, amorphous silicon (a: Si), Si-rich silicon oxide, silicon oxynitride (SiON), or polysilicon, each of which may be deposited by CVD or other techniques. In an alternative embodiment, the silicon-containing material may comprise a multi-layer film comprising a combination of silicon nitride (SiN) with one or more of the aforementioned materials. In such an alternative embodiment, the top layer of the multi-layer film may comprise one the aforementioned materials other than SiN.

In embodiments according to the present invention, the thickness of the silicon liner is a predetermined thickness. In a specific embodiment, the thickness of the layer is less than 500 Å, although this specific thickness is not required by the present invention. In alternative embodiments, the thickness of the layer is up to 1000 Å. In one embodiment, an a:Si layer is deposited using an Applied Centura Ultima HDP-CVD® chamber available from Applied Materials, Inc. of Santa Clara, Calif. In a specific embodiment according to the present invention, a Si-rich silicon oxide ($Si_xO_y$) is deposited with a predetermined ratio of silicon to oxygen (x:y). In a particular embodiment, the Si-rich silicon oxide is a non-stoichiometric oxide with the ratio of x:y greater than 0.63. In an alternative embodiment, the ratio of x:y is 1:0.

Figure 3C:
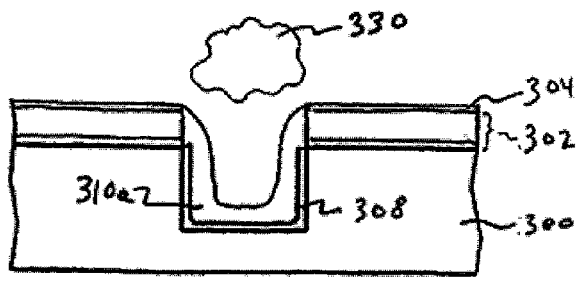

Continuing through the flow chart shown in FIG. 2, in the next step (266) also shown in cross-section in FIG. 3C, the silicon-containing material deposited in the previous step is removed from outside of the trench and from upper regions of the trench, through the use of a directional or anisotropic etch process. In one embodiment, exposure of the substrate to energized sputtering gases such as Ar, He, Xe, $H_2$, or other gases 330 is utilized. Other directional etch processes are utilized in alternative embodiments. In an embodiment according to the present invention, the directional etch process is terminated when the ARC layer 304 is reached. Thus, in this embodiment, the silicon-containing material is only present in the trench. Removal of a portion of the silicon-containing material in this manner leaves a silicon-containing liner 310a overlying the thermal oxide 308 within the trench 306 as illustrated in FIG. 3C.

Figure 3D:
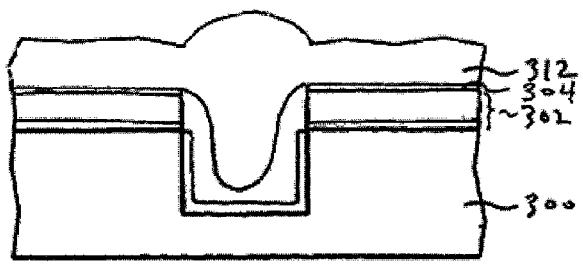

Silicon liner 310a in turn serves as a template for the selective deposition of oxide 312 in the subsequent step (268), shown in simplified cross-section in FIG. 3D. This selective oxide deposition process is described in detail in published European Patent Application EP 0 959 496 A2, incorporated by reference herein for all purposes. In some embodiments according to the present invention, the selective deposition of oxide is performed in a Producer SE SACVD® process chamber available from Applied Materials, Inc. of Santa Clara, Calif. The presence of the silicon liner in the embodiment illustrated in FIGS. 2 and 3 allows the selective oxide deposition step to be integrated with a thermally grown oxide liner.

Specifically, typically an inert gas is flowed into the chamber to stabilize the pressure in the chamber before reactive process gases are introduced. Next, a precursor having a surface sensitivity and growth rate dependence on differently constituted surfaces is introduced into the chamber. An example of a suitable precursor is TEOS. Because TEOS is a liquid precursor, a suitable apparatus directs the bubbling of a delivery gas, such as helium, through the TEOS in a bubbler assembly, or introducing of a carrier gas, such as helium or nitrogen, to a liquid injection system to vaporize the TEOS and form a process gas having the desired flow rates.

An ozone gas is flowed into the chamber to react with the TEOS and deposit an $O_3$/TEOS trench fill layer over the substrate. The deposition rate of the $O_3$/TEOS layer is faster on the lower trench bottom in the trench (which is lined with the silicon-containing material) than on the higher surfaces of the upper portions of the substrate that include the etch stop layer (including but not limited to, a CVD ARC or an LPCVD nitride in accordance with various embodiments of the present invention).

The relative deposition rates of the $O_3$/TEOS layer on the upper and lower surfaces within the recess may be regulated by adjusting the $O_3$/TEOS ratio until the $O_3$/TEOS layer develops a substantially self-planarized dielectric surface.

The $O_3$/TEOS ratio can be adjusted by adjusting the flow rates of the $O_3$, the TEOS, or both the $O_3$ and TEOS. For instance, in one embodiment, a predetermined $O_3$/TEOS ratio is selected and the relative flow rates are adjusted to achieve the predetermined ratio. In a particular embodiment, it is advantageous to maximize the $O_3$/TEOS ratio to accelerate the deposition in the trench to achieve planarity. In this particular embodiment, the predetermined $O_3$/TEOS ratio is higher than about 10:1. In alternative embodiments, the $O_3$/TEOS ratio is in the range of about 10:1 to 20:1. In a specific embodiment, the $O_3$/TEOS ratio is about 13:1.

The deposition of the trench fill layer can take place at a relatively low temperature of less than about 500° C. This advantageously avoids the undesirable aluminum fluoride formation which may occur when deposition occurs at high temperatures exceeding about 500° C. in processing chambers that include aluminum materials. This low temperature deposition process also avoids the longer cleaning time required to remove the resulting aluminum fluoride. Other process parameters such as pressure and flow rates can be adjusted to optimize the deposition process for a selected $O_3$/TEOS ratio. A pressure ranging from about 200 to 700 Torr is preferable for use with $O_3$/TEOS ratios of 10:1 to 20:1.

In some embodiments of the present invention, the selectively deposited oxide may be annealed after deposition in order to further densify and improve the quality of the trench fill layer (optional step 270). Embodiments in accordance with the present invention utilizing this optional annealing step, perform the annealing step in a nitrogen environment at a temperature in the range of about 900–1050° C., for about 30–90 minutes. In a specific embodiment, a 30 minute nitrogen anneal at 1,000° C. is performed. A dense layer of deposited oxide is advantageous, particularly for isolation purposes.

Figure 3E:
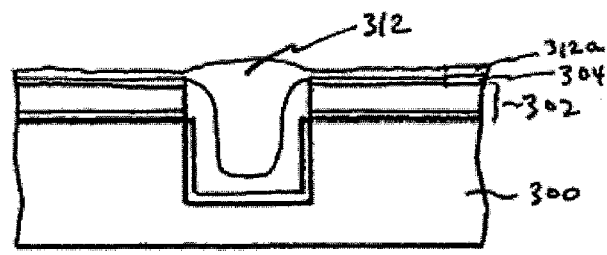

Referring again back to the flow chart of FIG. 2, in the next step (272) shown in simplified cross-section in FIG. 3E, selectively deposited oxide 312 is etched back by exposure to an etch process. In one embodiment according to the present invention, the etch process is a plasma etch containing fluorine radicals. In one embodiment, this etchback process is halted upon exposure to the underlying ARC layer 304. For example, if the sensitivity to the ARC layer 304 results in a poor quality film, the layer 312a is completely removed. In a second embodiment, such as the one illustrated in FIG. 3E, the etchback process is halted just above the ARC layer 304, leaving some oxide layer 312a remaining on top of the ARC layer. The etch process selected will typically depend on the particular device integration scheme utilized.

In some embodiments of the present invention, a CMP process may be performed after the etchback step to further planarize the surface of the substrate. This CMP process can be performed without the use of a reverse mask and etch procedure because of the substantially planar surface already present as illustrated in FIG. 3E. Thus the CMP process can be completed more quickly than in the conventional case where the dielectric profile is stepped, such as that shown in FIG. 1f, further decreasing process time and increasing throughput.

Figure 3F:
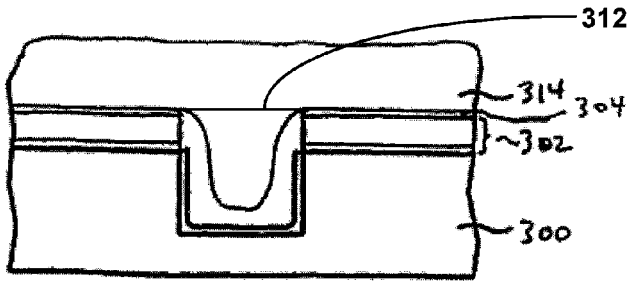

In the final step (274) shown in simplified cross-section in FIG. 3F, a capping layer of oxide 314 is deposited over the oxide-filled trench feature. In one embodiment according to the present invention, the oxide cap is deposited utilizing a CVD process. This CVD process produces a substantially planarized cap layer as illustrated in FIG. 3F.

In contrast with the prior selective deposition of oxide material within the trench in step 268, the CVD cap layer 314 is deposited on top of the oxide layer 312, continuously present on the wafer surface. Thus, no selection of predetermined growth ratios is made in this embodiment.

While the above-referenced figures and accompanying description relate to embodiments in accordance with the present invention which form an STI structure in a substrate, this is not required by the present invention. Alternative embodiments in accordance with the present invention could deposit a silicon liner layer prior to selective oxide deposition within other types of features, for example between raised features present on the surface of a semiconductor workpiece, as are present during the pre-metal dielectric (PMD) deposition step.

Numerous benefits are achieved using the present invention over conventional techniques. For example, a thermal oxide layer can be grown in the trench, reducing the damage resulting from the process of etching the trench. Selective deposition of oxide as a trench fill material is performed after deposition of a silicon liner. Thus, this process allows for a selective deposition of oxide to be integrated with a thermal oxide liner. The substantially self-planarized dielectric surface produced by the selective deposition step reduces the need for CMP and other planarization processes. Depending upon the embodiment, one or more of these benefits may exist. These and other benefits have been described throughout the present specification and more particularly below.

Figure 4:
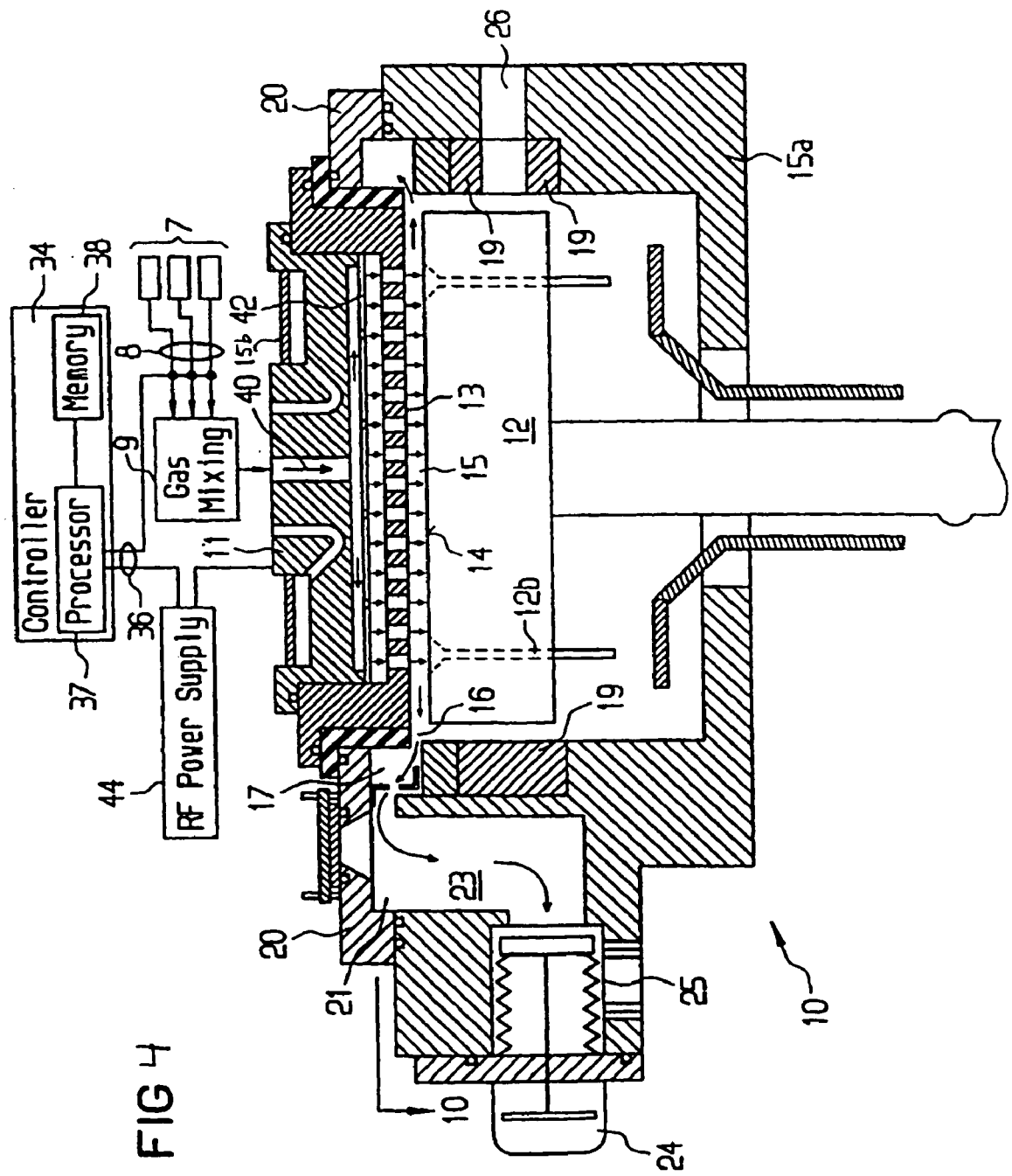
FIG. 4 is a simplified schematic vertical cross-sectional view of one embodiment of a chemical vapor deposition (CVD) apparatus according to the present invention.
Figure 5:
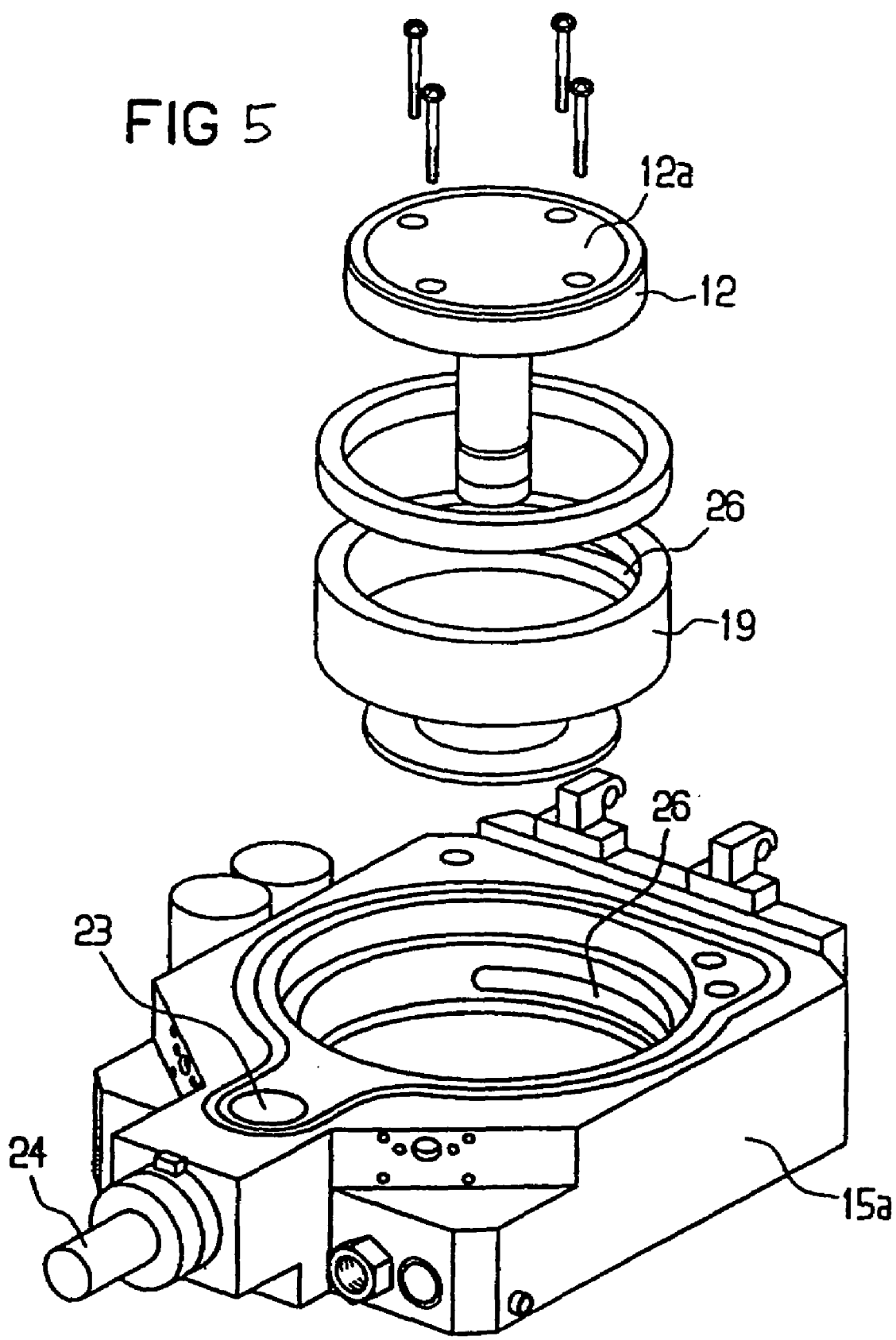
FIGS. 5 and 6 are simplified exploded perspective views of parts of the CVD apparatus depicted in FIG. 4.
Figure 6:
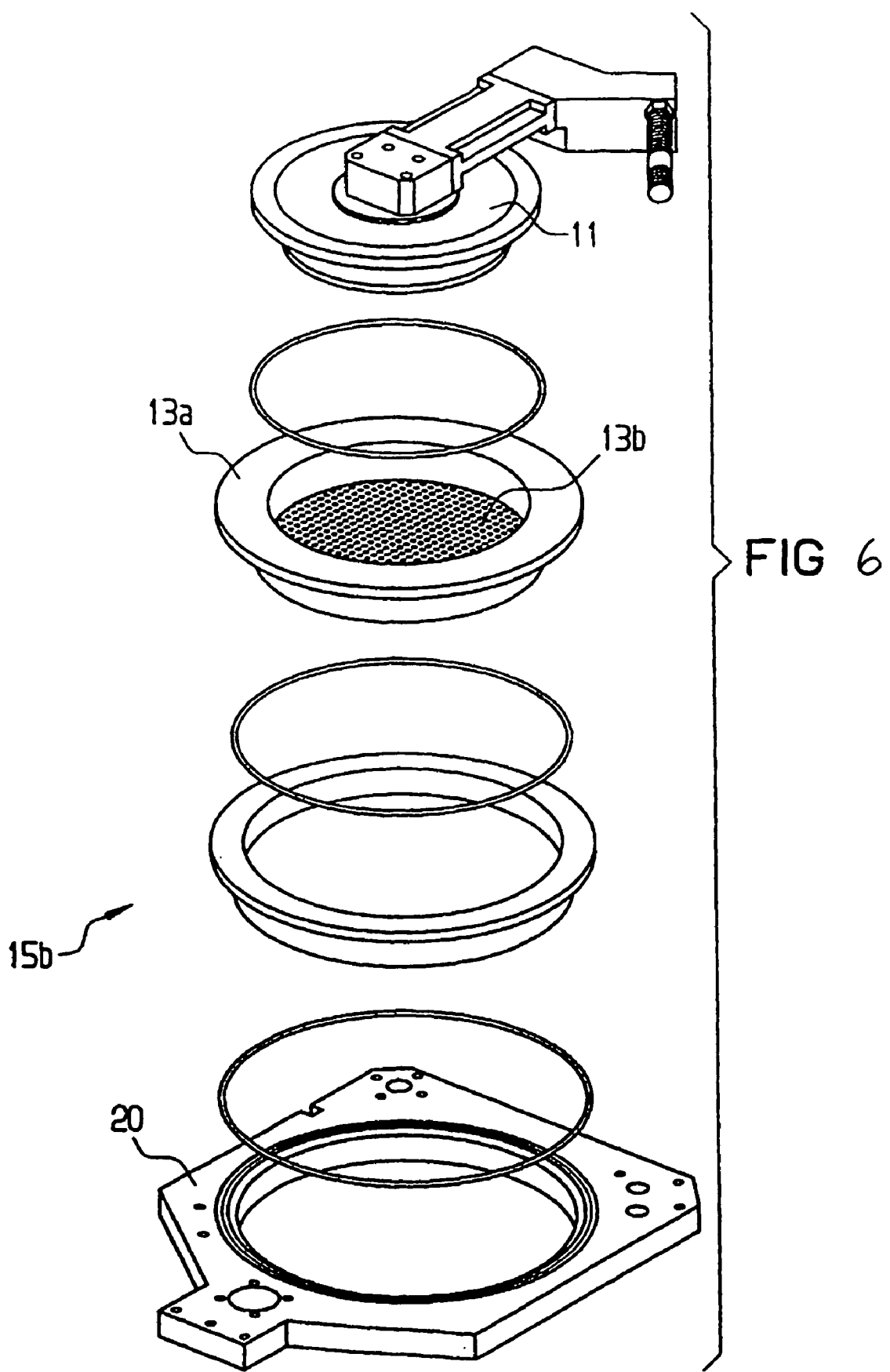

One suitable CVD apparatus in which the method of the present invention can be carried out is shown in FIG. 4, which is a vertical, cross-sectional view of a CVD system 10, having a vacuum or processing chamber 15 that includes a chamber wall 15a and chamber lid assembly 15b. Chamber wall 15a and chamber lid assembly 15b are shown in exploded, perspective views in FIGS. 5 and 6.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (not shown) and an upper processing position (shown in FIG. 4), which is closely adjacent to manifold 11. A centerboard (not shown) includes sensors for providing information on the position of the wafers.

Deposition and carrier gases are introduced into chamber 15 through perforated holes 13b (FIG. 6) of a conventional flat, circular gas distribution or face-plate 13a. More specifically, deposition process gases flow into the chamber through the inlet manifold 11 (indicated by arrow 40 in FIG. 4), through a conventional perforated blocker plate 42 and then through holes 13b in gas distribution faceplate 13a.

Before reaching the manifold, deposition and carrier gases are input from gas sources 7 through gas supply lines 8 (FIG. 4) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The 5,558,717 patent is assigned to Applied Materials, Inc., the assignee of the present invention, and is hereby incorporated by reference.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position (not shown). The motor, valves or flow controllers connected to the supply lines 8, gas delivery system, throttle valve, RF power supply 44, and chamber and substrate heating systems are all controlled by a system controller 34 (FIG. 4) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard 45 which defines board, card cage, and connector dimensions and types. The VME standard also defines the bus structure as having a 16-bit data bus and a 24-bit address bus.

It should be understood that the inventions described herein can be employed in various integrated circuit fabrication processes that uses gap-fill steps. This includes pre-metal dielectric, inter-metal dielectric, and shallow trench isolation, to name just a few examples. Although various embodiments which incorporate teachings of the present invention have been shown and described in detail herein, those skilled in the art can readily devise many other varied embodiments that still incorporate these teachings.

What is claimed is:

1. A method of depositing a fill layer in a recess, comprising:
    disposing in a substrate processing chamber a substrate having a recess;
    forming a first insulating layer within the recess;
    depositing a silicon containing layer on the substrate;
    removing an upper portion of the silicon containing layer while maintaining a portion of the silicon containing layer within the recess;
    selectively depositing a second insulating layer within the recess, wherein the deposition of the second insulating layer comprises,
        introducing a precursor into the substrate processing chamber;
        flowing ozone into the substrate processing chamber to react with the precursor to deposit the second insulating layer; and
        adjusting the ratio of ozone:precursor to regulate deposition of the second insulating layer within the recess;
    etching the second insulating layer; and
    depositing a third insulating layer on the substrate and over the second insulating layer to form a capping layer.

2. The method of claim 1 wherein the recess comprises a trench in the substrate.

3. The method of claim 1 wherein the recess comprises a gap between raised features present on a surface of the substrate.

4. The method of claim 1 wherein forming the first insulating layer comprises forming a silicon oxide layer.

5. The method of claim 4 wherein the silicon oxide layer is thermally grown.

6. The method of claim 1 wherein forming the silicon containing layer comprises performing chemical vapor deposition of the group consisting of amorphous silicon, polysilicon, silicon oxide, and silicon nitride.

7. The method of claim 1 wherein forming the silicon containing layer comprises forming a non-stoichiometric silicon-rich silicon oxide layer with a Si:O ratio of greater than 0.63.

8. The method of claim 1 wherein the step of removing an upper portion of the silicon containing layer further comprises a step of sputtering the substrate with a gas.

9. The method of claim 8 wherein the gas is selected from the group consisting of hydrogen, helium, xenon, and argon.

10. The method of claim 1 wherein the step of etching the second insulating layer further comprises etching the second insulating layer in an environment containing fluorine radicals.

11. The method of claim 10 wherein the step of etching the second insulating layer is terminated prior to complete removal of the second insulating layer.

12. The method of claim 1 wherein flowing the precursor comprises flowing TEOS.

13. The method of claim 12 wherein the ratio of ozone:precursor is between about 10:1 and 20:1.

14. The method of claim 13 wherein the ratio of ozone:precursor is about 13:1.

15. The method of claim 1 further comprising the step of annealing the substrate after the step of selectively depositing the second insulating layer within in the recess.

16. The method of claim 15

17. A method of performing gap-fill in a high aspect ratio recess, the method comprising:
- forming an oxide liner within a high aspect ratio recess on a semiconductor workpiece;
- depositing a silicon containing liner on the workpiece and within the recess over the oxide liner;
- etching the silicon containing liner to remove a portion of the silicon containing liner from outside of the recess and from an upper portion of the recess;
- selectively depositing a first insulating layer within the trench overlying the silicon containing liner, wherein the deposition of the first insulating layer comprises,
  - introducing a precursor into the substrate processing chamber;
  - flowing ozone into the substrate processing chamber to react with the precursor to deposit the first insulating layer; and
  - adjusting the ratio of ozone:precursor to regulate deposition of the first insulating layer within the recess;
- etching the first insulating layer; and
- depositing a second insulating layer.

18. The method of claim 17 wherein the high aspect ratio recess comprises a trench formed in the workpiece.

19. The method of claim 17 wherein the high aspect ratio recess comprises a gap between raised features present in a surface of the workpiece.

20. The method of claim 17 wherein an aspect ratio of the recess is 6:1 or greater.

21. The method of claim 17 wherein depositing the silicon containing liner comprises performing chemical vapor deposition of a material selected from the group consisting of amorphous silicon, polysilicon, silicon oxide, and silicon nitride.

22. The method of claim 17 wherein forming the silicon containing liner comprises forming a non-stoichiometric silicon-rich oxide layer with a Si:O ratio of greater than 0.63.

23. The method of claim 17 wherein the step of etching the silicon containing liner comprises performing an anisotropic etch.

24. The method of claim 23 wherein the anisotropic etch is a sputter etch utilizing species selected from the group consisting of hydrogen, helium, argon, and xenon.

* * * * *

UNITED STATES PATENT AND TRADEMARK OFFICE
CERTIFICATE OF CORRECTION

PATENT NO.       : 7,176,105 B2                              Page 1 of 1
APPLICATION NO.  : 10/858135
DATED            : February 13, 2007
INVENTOR(S)      : Namani et al.

It is certified that error appears in the above-identified patent and that said Letters Patent is hereby corrected as shown below:

Column 11, claim 16, line 1, delete "16. The method of claim 15" and insert --16. The method of claim 15 wherein the anneal step is carried out at between about 900-1050°C for between about 30-90 minutes.--.

Signed and Sealed this

Tenth Day of June, 2008

JON W. DUDAS
*Director of the United States Patent and Trademark Office*